United States Patent
Minagawa et al.

(10) Patent No.: US 9,293,212 B2
(45) Date of Patent: Mar. 22, 2016

(54) NONVOLATILE SEMICONDUCTOR MEMORY DEVICE INCLUDING A PLURALITY OF NAND STRINGS IN A MEMORY CELL ARRAY

(71) Applicant: KABUSHIKI KAISHA TOSHIBA, Minato-ku (JP)

(72) Inventors: Hiroe Minagawa, Fujisawa (JP); Noboru Ooike, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 9 days.

(21) Appl. No.: 14/296,903

(22) Filed: Jun. 5, 2014

(65) Prior Publication Data

US 2015/0262688 A1 Sep. 17, 2015

(30) Foreign Application Priority Data

Mar. 13, 2014 (JP) .................................. 2014-50205

(51) Int. Cl.
*G11C 16/04* (2006.01)
*G11C 16/26* (2006.01)
*G11C 11/56* (2006.01)
*G11C 29/04* (2006.01)

(52) U.S. Cl.
CPC ............ *G11C 16/26* (2013.01); *G11C 11/5642* (2013.01); *G11C 16/0483* (2013.01); *G11C 2029/0411* (2013.01)

(58) Field of Classification Search
CPC ........... G11C 11/5628; G11C 11/5642; G11C 11/5621
USPC ................................ 365/185.03, 185.17, 104
See application file for complete search history.

(56) References Cited

U.S. PATENT DOCUMENTS

| | | | | | |
|---|---|---|---|---|---|
| 5,822,243 | A | * | 10/1998 | Shone | 365/185.08 |
| 6,785,167 | B2 | * | 8/2004 | Kurth et al. | 365/189.15 |
| 8,385,126 | B2 | | 2/2013 | Shiino et al. | |
| 8,479,083 | B2 | | 7/2013 | Chae et al. | |
| 2008/0123405 | A1 | * | 5/2008 | Thomas | 365/185.03 |
| 2011/0007568 | A1 | * | 1/2011 | Chang et al. | 365/185.17 |
| 2014/0286099 | A1 | * | 9/2014 | Shirakawa | 365/185.12 |

FOREIGN PATENT DOCUMENTS

| | | |
|---|---|---|
| JP | 3623756 | 2/2005 |
| JP | 2010-108548 | 5/2010 |
| JP | 2011-165301 | 8/2011 |
| JP | 2012-133832 | 7/2012 |

* cited by examiner

*Primary Examiner* — Connie Yoha
(74) *Attorney, Agent, or Firm* — Oblon, McClelland, Maier & Neustadt, L.L.P.

(57) ABSTRACT

A nonvolatile semiconductor memory device according to one embodiment includes a control circuit. The control circuit is configured to apply, when reading data of a first selected memory cell provided in a ROM area, a first read voltage to a first selected word line, and apply a first read pass voltage lower than a second read pass voltage to a first non-selected word line, thus allowing for the ROM area reading operation of reading a threshold voltage set in the first selected memory cell. The control circuit is configured to apply, when reading data of a second selected memory cell provided in a normal storage area, a second read voltage to a second selected word line, and apply the second read pass voltage to a second non-selected word line, thus allowing for a normal storage area reading operation of reading a threshold voltage set in the second selected memory cell.

19 Claims, 10 Drawing Sheets

ROM AREA READ OPERATION

NORMAL STORAGE AREA READ OPERATION

FIG. 8

TEMPPARA9 (Add=BBh)

| [7] | [6] | [5] | [4] | [3] | [2] | [1] | [0] | DVREAD [V] |
|---|---|---|---|---|---|---|---|---|
| | | | 1 | 0 | 0 | 0 | 0 | −3.2 |
| | | | 1 | 0 | 0 | 0 | 1 | −3.0 |
| | | | 1 | 0 | 0 | 1 | 0 | −2.8 |
| | | | 1 | 0 | 0 | 1 | 1 | −2.6 |
| | | | 1 | 0 | 1 | 0 | 0 | −2.4 |
| | | | 1 | 0 | 1 | 0 | 1 | −2.2 |
| | | | 1 | 0 | 1 | 1 | 0 | −2.0 |
| | | | 1 | 0 | 1 | 1 | 1 | −1.8 |
| | | | 1 | 1 | 0 | 0 | 0 | −1.6 |
| | | | 1 | 1 | 0 | 0 | 1 | −1.4 |
| | | | 1 | 1 | 0 | 1 | 0 | −1.2 |
| | | | 1 | 1 | 0 | 1 | 1 | −1.0 |
| | | | 1 | 1 | 1 | 0 | 0 | −0.8 |
| | | | 1 | 1 | 1 | 0 | 1 | −0.6 |
| | | | 1 | 1 | 1 | 1 | 0 | −0.4 |
| | | | 1 | 1 | 1 | 1 | 1 | −0.2 |

TEMPPARA9 (Add=BBh)

| [7] | [6] | [5] | [4] | [3] | [2] | [1] | [0] | DVREAD [V] |
|---|---|---|---|---|---|---|---|---|
| | | | 0 | 0 | 0 | 0 | 0 | 0.0 |
| | | | 0 | 0 | 0 | 0 | 1 | 0.2 |
| | | | 0 | 0 | 0 | 1 | 0 | 0.4 |
| | | | 0 | 0 | 0 | 1 | 1 | 0.6 |
| | | | 0 | 0 | 1 | 0 | 0 | 0.8 |
| | | | 0 | 0 | 1 | 0 | 1 | 1.0 |
| | | | 0 | 0 | 1 | 1 | 0 | 1.2 |
| | | | 0 | 0 | 1 | 1 | 1 | 1.4 |
| | | | 0 | 1 | 0 | 0 | 0 | 0.0 |
| | | | 0 | 1 | 0 | 0 | 1 | 0.2 |
| | | | 0 | 1 | 0 | 1 | 0 | 0.4 |
| | | | 0 | 1 | 0 | 1 | 1 | 0.6 |
| | | | 0 | 1 | 1 | 0 | 0 | 0.8 |
| | | | 0 | 1 | 1 | 0 | 1 | 1.0 |
| | | | 0 | 1 | 1 | 1 | 0 | 1.2 |
| | | | 0 | 1 | 1 | 1 | 1 | 1.4 |

(a): BINARY DATA STORAGE (b): FOUR-LEVEL DATA STORAGE

FIRST NORMAL-STORAGE-AREA READ OPERATION

SECOND NORMAL-STORAGE-AREA READ OPERATION

NONVOLATILE SEMICONDUCTOR MEMORY DEVICE INCLUDING A PLURALITY OF NAND STRINGS IN A MEMORY CELL ARRAY

CROSS REFERENCE TO RELATED APPLICATION

This application is based upon and claims the benefit of priority from prior Japanese Patent Application No. 2014-50205, filed on Mar. 13, 2014, the entire contents of which are incorporated herein by reference.

BACKGROUND

1. Field

The present embodiments relate to a non-volatile semiconductor memory device.

2. Description of the Related Art

As an electrically rewritable and highly integratable nonvolatile semiconductor memory device, a NAND flash memory is known. The memory cells of the NAND flash memory each include a semiconductor substrate, a charge accumulation layer formed on the substrate via a tunnel insulating film, and a control gate stacked on the charge accumulation layer via an inter-gate dielectric film. Each memory cell stores data in a non-volatile manner using the charge accumulation state of the charge accumulation layer.

In the NAND flash memory, the memory cells are degraded as the number of write/erase operations increases, thus making it hard to store data correctly. As a result, a malfunction may occur in reading data.

BRIEF DESCRIPTION OF THE DRAWINGS

FIG. 8 illustrates the sequence in the ROM area read operation of the nonvolatile semiconductor memory device according to the first embodiment.

DETAILED DESCRIPTION

A nonvolatile semiconductor memory device according to one embodiment includes: a memory cell array including a plurality of NAND strings arranged therein, each NAND string including a memory string including a plurality of memory cells connected in series, and a first select transistor and a second select transistor connected to respective two ends of the memory string, a plurality of word lines connected to respective control gate electrodes of the memory cells; a plurality of bit lines connected to respective first ends of the NAND strings; a source line connected to second ends of the NAND strings; and a control circuit performing reading of data of the memory cells. The memory cell array includes a ROM area for data read and a normal storage area capable of arbitrary write/erase of data. The control circuit is configured to apply, when reading data of a first selected memory cell provided in the ROM area, a first read voltage to a first selected word line connected to the first selected memory cell, and apply to a first non-selected word line connected to a first non-selected memory cell provided in the ROM area, a first read pass voltage for rendering conductive regardless of data held in the first non-selected memory cell, thus allowing for a ROM area reading operation of reading a threshold voltage set in the first selected memory cell. The control circuit is configured to apply, when reading data of a second selected memory cell provided in the normal storage area, a second read voltage to a second selected word line connected to the second selected memory cell, and apply to a second non-selected word line connected to a second non-selected memory cell provided in the normal storage area, the second non-selected memory cell storing data of a same bit number as data of the first non-selected memory cell, a second read pass voltage for rendering conductive regardless of data held in the second non-selected memory cell, thus allowing for a normal storage area reading operation of reading a threshold voltage set in the second selected memory cell. The first read pass voltage is lower than the second read pass voltage.

With reference now to the drawings, nonvolatile semiconductor memory devices according to the present embodiments will be described.

First Embodiment

Figure 1:
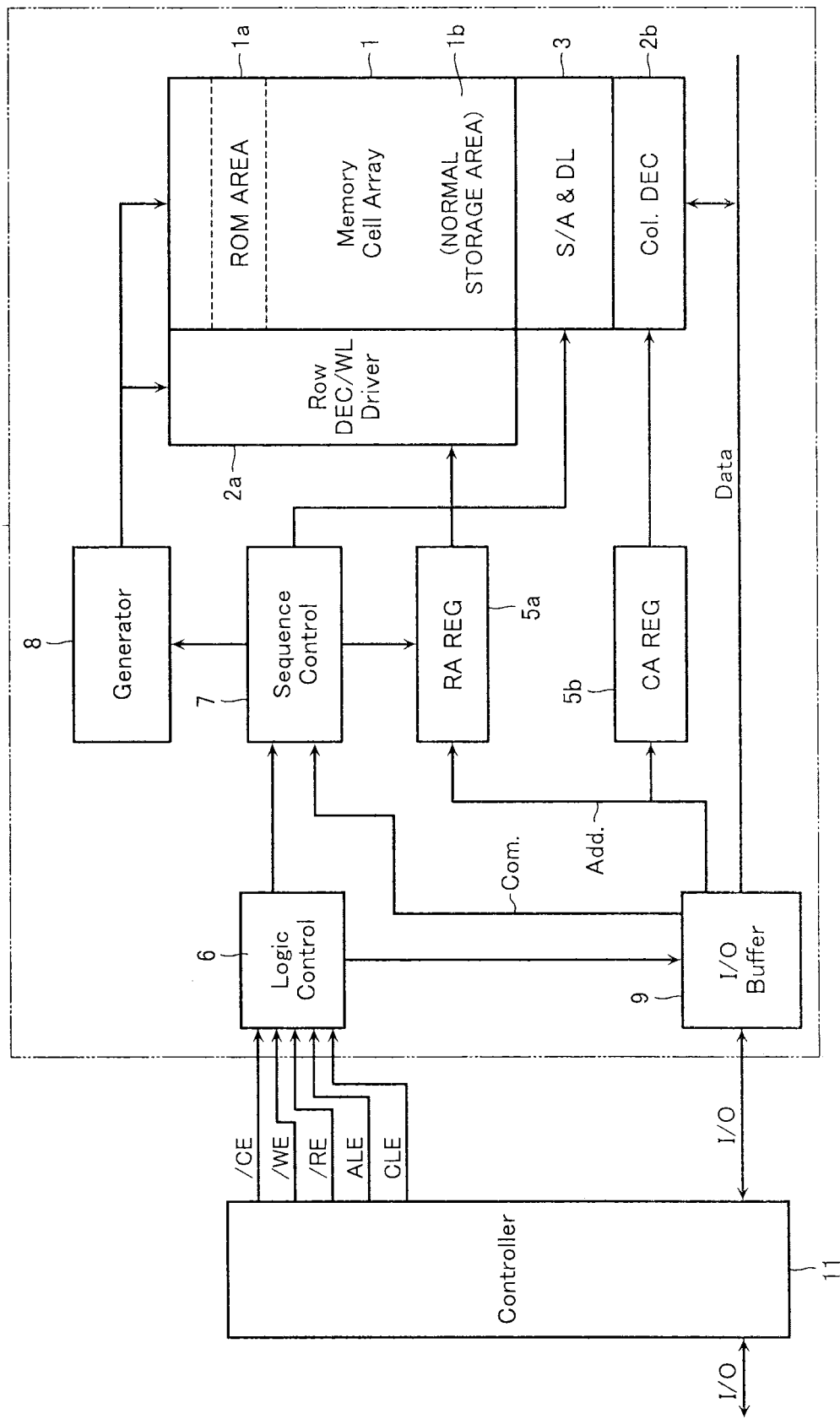
FIG. 1 is a block diagram of a non-volatile semiconductor memory device according to a first embodiment.

First, the entire configuration of a nonvolatile semiconductor memory device according to a first embodiment will be described. FIG. 1 is a block diagram of the nonvolatile semiconductor memory device according to this embodiment.

A NAND flash memory includes a NAND chip 10 and a controller 11 for controlling the NAND chip 10. The NAND chip 10 includes a memory cell array 1. The memory cell array 1 includes a plurality of floating gate memory cells arranged in a matrix. Each memory cell includes a semiconductor substrate, a charge accumulation layer formed on the substrate via a tunnel insulating film, and a control gate stacked on the charge accumulation layer via an inter-gate dielectric film.

The memory cell array 1 includes a ROM area 1a storing information such as a device ID code that the user may solely read and a normal storage area 1b in which the user may arbitrarily write/erase data through the user's operation. The ROM area 1a may store, in addition to user read information, various types of information used for the control of the device such as in data write or data read.

The memory cell array 1 includes therearound a row decoder/word line driver 2a, a column decoder 2b, a sense amplifier/latch circuit 3, a logic control circuit 6, a sequence control circuit 7, and a voltage generation circuit 8. The row decoder/word line driver 2a, the column decoder 2b, the sense amplifier/latch circuit 3, the logic control circuit 6, the sequence control circuit 7, and the voltage generation circuit 8 form a control circuit. They write or read data from the memory cell array 1 in units of a page.

The row decoder/word line driver 2a drives a word line and a select gate line of the memory cell array 1. The sense amplifier/latch circuit 3 includes a sense amplifier circuit S/A and a data holding circuit DL that provide one-page data. The sense amplifier/latch circuit 3 provides one-page read data. The read data is sequentially column selected by the column decoder 2b and then output to an external I/O terminal via an I/O buffer 9. The I/O terminal provides write data. The write data is selected by the column decoder 2b and then loaded into the sense amplifier/latch circuit 3. One-page write data is loaded into the sense amplifier/latch circuit 3. A row address signal and a column address signal are input via the I/O buffer 9 and then transferred to the row decoder 2a and the column decoder 2b, respectively. A row address register 5a holds an erase block address in an erase operation and holds a page address in a write operation or a read operation. A column address register 5b receives a start column address for loading the write data before starting the write operation and a start column address for the read operation. Until a write enable signal /WE and a read enable signal /RE are changed in a predetermined condition, the column address register 5b stores the input column addresses.

The logic control circuit 6 controls, on the basis of control signals including a chip enable signal /CE, a command latch enable signal CLE, an address latch enable signal ALE, the write enable signal /WE, and the read enable signal /RE, the input of the command and address and the input/output of data. The read operation and the write operation are performed with commands. In response to a command, the sequence control circuit 7 performs a sequence control of the read operation and the write or erase operation. The voltage generation circuit 8 is controlled by the sequence control circuit 7 to generate predetermined voltages necessary for various operations.

A controller 11 controls the data write and read in a condition suitable for the current write state of the NAND chip 10. Note that a portion of the write operation described below may be performed on the NAND chip 10 side.

[Memory Cell Array]

Figure 2:
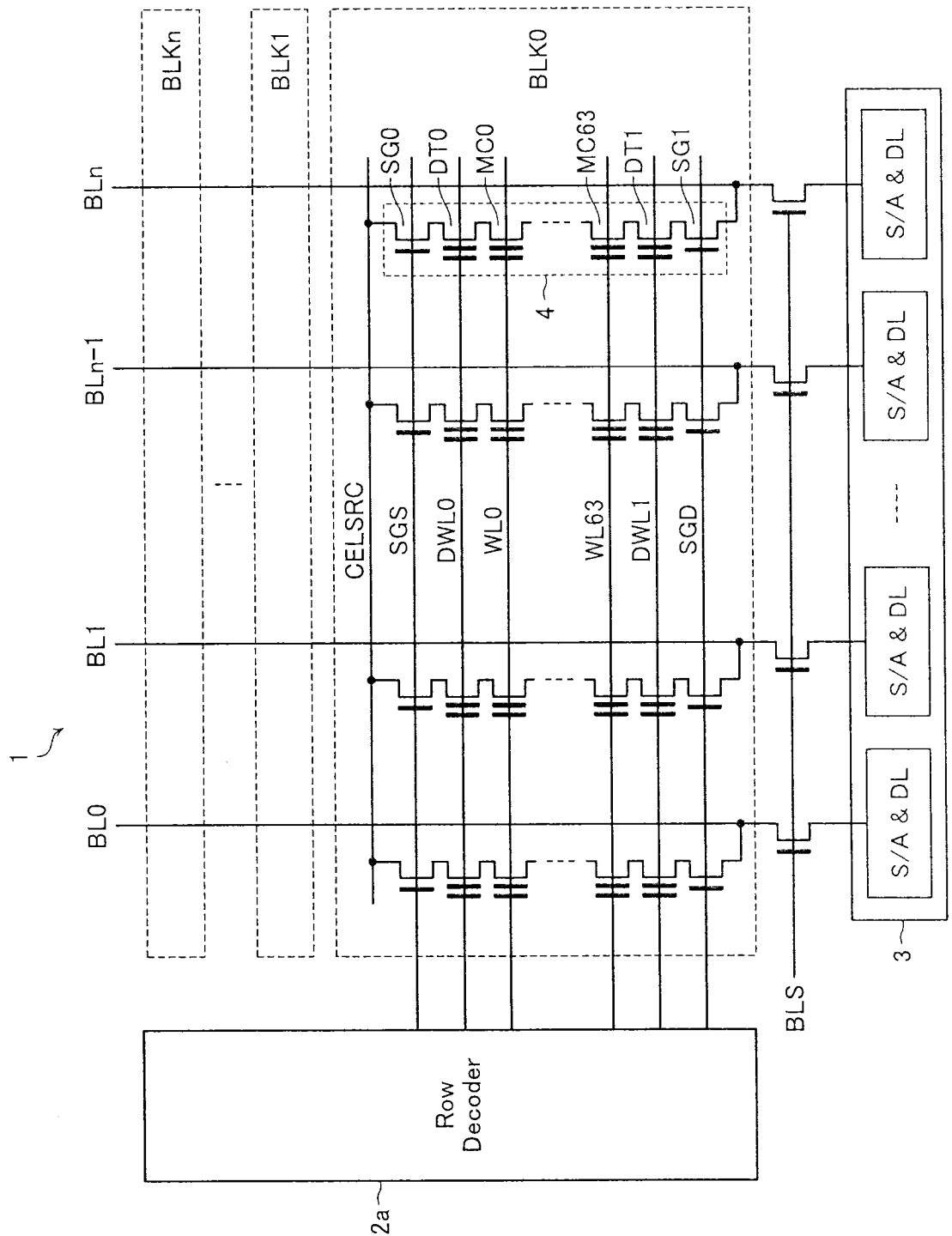
FIG. 2 is a circuit diagram of a memory cell array and peripheral circuits of the non-volatile semiconductor memory device according to the first embodiment.
Figure 3:
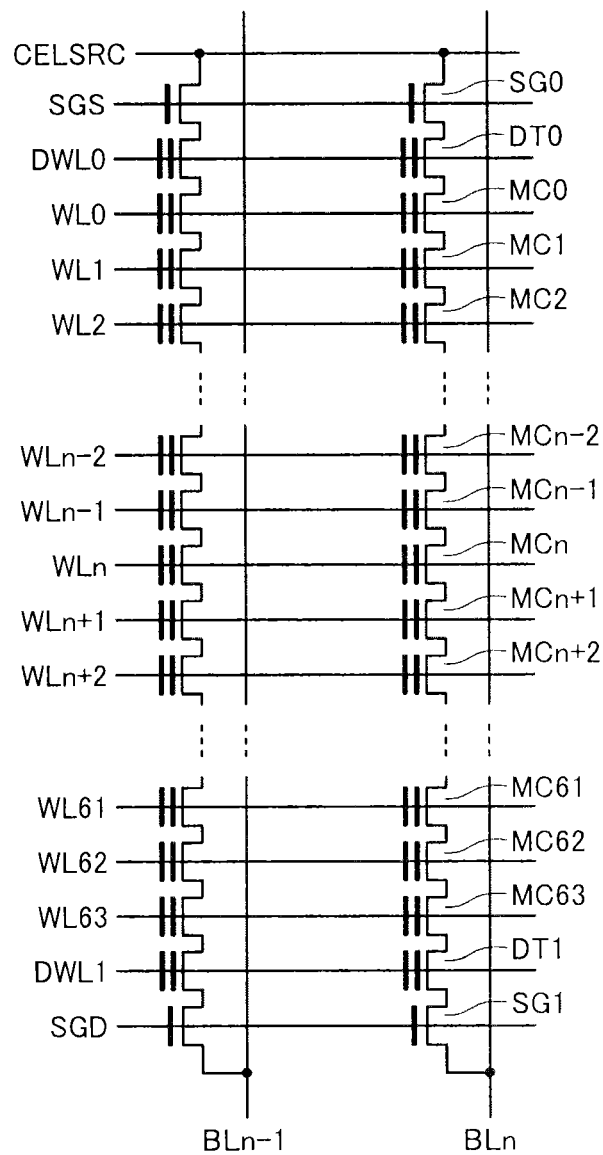
FIG. 3 is a circuit diagram of the memory cell array of the non-volatile semiconductor memory device according to the first embodiment.

Next, a description is given of the memory cell array 1 and the sense amplifier/latch circuit 3 of the nonvolatile semiconductor memory device according to this embodiment. FIG. 2 is a circuit diagram showing the memory cell array 1 and the peripheral circuits. FIG. 3 is a circuit diagram showing the memory cell array 1.

With reference to FIGS. 2 and 3, a NAND string 4 includes a memory string including 64 memory cells MC0 to MC63 connected in series, dummy transistors DT0 and DT1 connected to the respective two ends of the memory string, and select gate transistors SG0 and SG1 connected to the respective dummy transistors DT0 and DT1. The select gate transistor SG0 has a source connected to a common source line CELSRC. The select gate transistor SG1 has a drain connected to a bit line BL (BL0 to BLn). The memory cells MC0 to MC63 have control gate electrodes connected to respective word lines WL (WL0 to WL63). The dummy transistors DT0 and DT1 have gate electrodes connected to respective dummy word lines DWL0 and DWL1. The select gate transistors SG0 and SG1 have gate electrodes connected to respective select gate lines SGS and SGD. Note that in the memory string, the number of memory cells MC connected in series is not limited to 64 and the number of dummy transistors DT connected to one end of the memory string is not limited to one. An arbitrary number of memory cells MC and dummy transistors DT may be provided.

The range of a plurality of memory cells MC along one word line WL is a page as the unit for collectively reading and writing data. In addition, the range of a plurality of NAND strings 4 arranged in the word line WL direction forms a block BLK as the unit for collectively erasing data. In FIG. 2, a plurality of blocks BLK0 to BLKn sharing each bit line BL are arranged in the bit line BL direction, thus forming the memory cell array 1. The word lines WL, the dummy word lines DWL, and the select gate lines SGS and SGD are driven by the row decoder/word line driver 2a.

[Data Storage State of Memory Cells]

Figure 4:
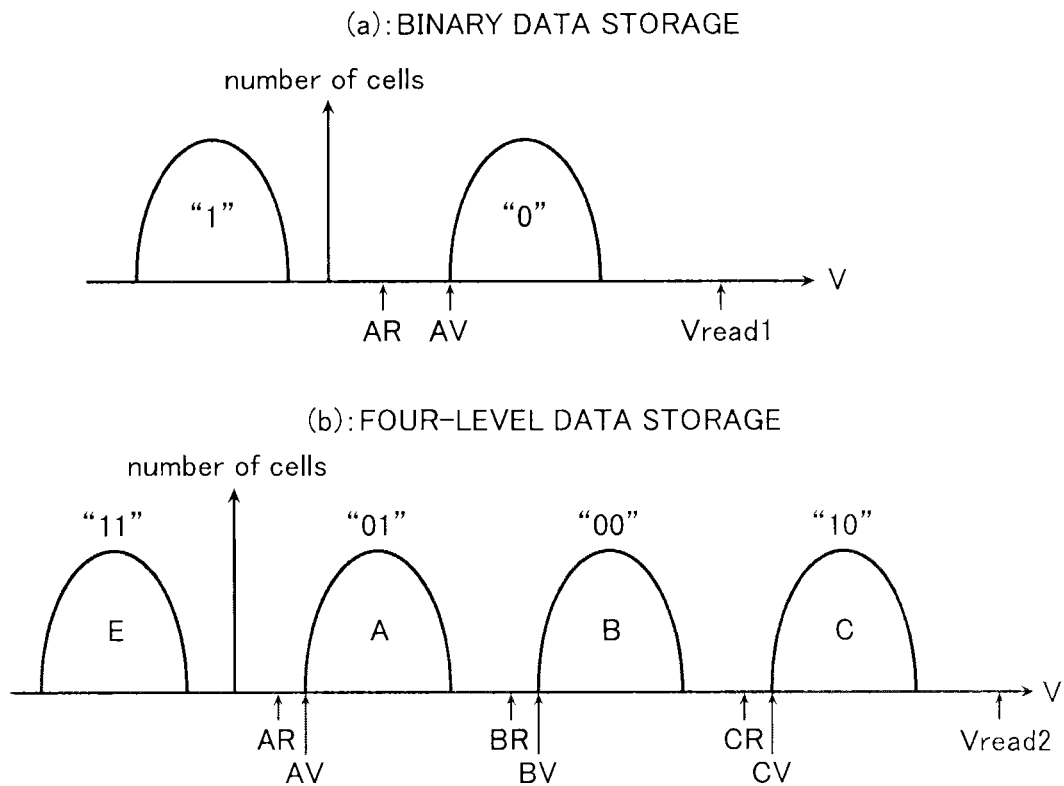
FIG. 4 shows threshold voltage distributions of memory cells of the nonvolatile semiconductor memory device according to the first embodiment.

Next, the data storage state of the memory cells of the NAND flash memory according to this embodiment will be described. FIG. 4 shows the threshold voltage distributions of each memory cell MC of the NAND flash memory according to this embodiment.

If each memory cell MC of the NAND flash memory stores binary data (1-bit/cell), the threshold voltage distributions of data are as shown in FIG. 4(a). The threshold voltage in the negative state corresponds to data "1" (erased state), and the threshold voltage in the positive state corresponds to data "0".

In addition, if each memory cell MC of the NAND flash memory stores four-level data (2-bit/cell), the threshold voltage distributions of data are as shown in FIG. 4(a). In this case, from the lowest threshold voltage, four types of threshold voltage distributions are provided (E, A, B, and C). These threshold voltage distributions are allocated four sets of data "11", "01", "00", and "10", respectively. Here, the threshold voltage distribution E is a negative threshold voltage state obtained by the collective block erase in the erase operation. In addition, voltages AR, BR, and CR between the threshold voltage distributions are determination voltages in the read operation. The lower limit voltages AV, BV, and CV of the positive threshold voltage distributions are determination voltages in the write verify operation. In addition, a voltage Vread1 in binary data storage and a voltage Vread2 in four-level data storage are voltages higher than the upper limit of the highest threshold voltage distribution. The read pass voltage Vread1 or Vread2 is a voltage applied to the non-selected word lines WL in the read operation or in the write verify operation.

[Read Operation According to First Embodiment]

Next, the read operation of the nonvolatile semiconductor memory device according to the first embodiment will be described. Usually, the data read operation is performed with the word lines WL connected to the selected memory cells MC in the NAND string 4 being provided with any of the read voltages AR, BR, and CR. In addition, the word lines WL connected to the non-selected memory cells MC are applied with, regardless of data held in the memory cells MC, the read pass voltage Vread1 or Vread2 rendering conductive the memory cells MC. Then, the dummy word lines DWL0 and DWL1 connected to the dummy transistors DT0 and DT1 are also applied with the read pass voltage Vread1 or Vread2. Then, the select gate lines SGS and SGD are applied with a voltage Vsg for rendering conductive the select gate transistors SG0 and SG1.

The bit lines BL connected to the NAND string 4 having the selected memory cells MC are applied with a voltage Vb1 to detect using the sense amplifier/latch circuit 3 whether the NAND string 4 conducts a current, thus determining data.

Figure 5:
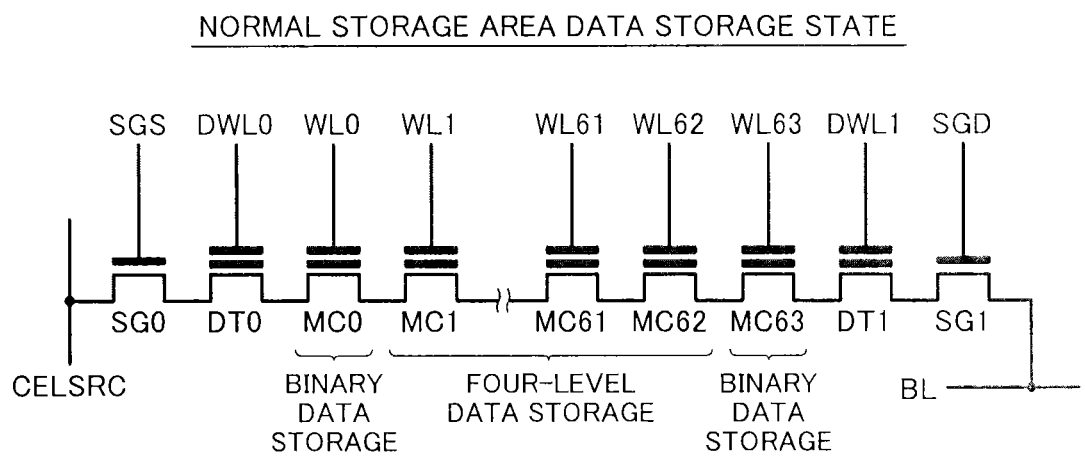
FIG. 5 shows a data storage state of the memory cells of the nonvolatile semiconductor memory device according to the first embodiment.
Figure 6A:
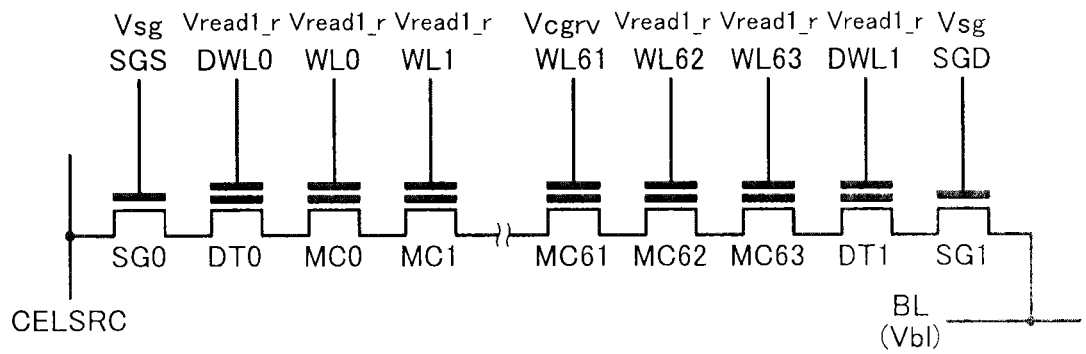
FIG. 6A illustrates applied voltages in ROM area read operation of the nonvolatile semiconductor memory device according to the first embodiment.
Figure 6B:
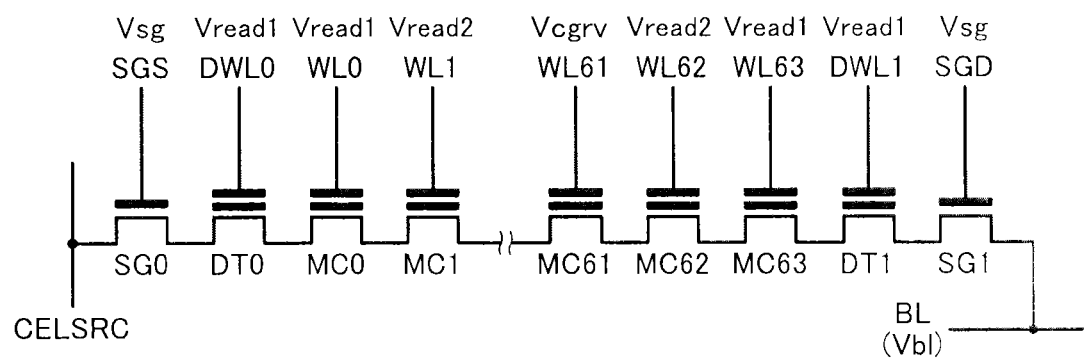
FIG. 6B illustrates applied voltages in normal storage area read operation of the nonvolatile semiconductor memory device according to the first embodiment.

A description is given below of the nonvolatile semiconductor memory device according to this embodiment with respect to the operations of reading data from the respective memory cells MC provided in the ROM area 1*a* and in the normal storage area 1*b*. Here, in the ROM area 1*a*, the memory cells MC storing binary data are disposed. In addition, in the normal storage area 1*b*, the memory cells MC storing binary data are disposed in some portions and the memory cells MC storing four-level data are disposed in other portions. For example, with reference to FIG. 5, in the normal storage area 1*b*, the memory cells MC connected to the word lines WL0 and WL63 adjacent to the dummy word lines DWL at the two ends of the memory string store binary data, and the memory cells MC connected to the other word lines WL1 to WL62 store four-level data. In the nonvolatile semiconductor memory device according to this embodiment, in the read operations of the ROM area 1*a* and the normal storage area 1*b*, the memory cells MC storing data of the same bit number (for example, the memory cells MC storing binary data) are applied with different values of the read pass voltage Vread1. With reference to FIGS. 6A and 6B, the read operation of the nonvolatile semiconductor memory device according to this embodiment will be described below.

FIG. 6A illustrates applied voltages in the ROM area read operation of the nonvolatile semiconductor memory device according to this embodiment. FIG. 6B illustrates applied voltages in the normal storage area read operation of the nonvolatile semiconductor memory device according to this embodiment.

With reference to FIG. 6A, the data read operation of the memory cells MC in the ROM area 1*a* is performed with the word lines WL (for example, the selected word line WL61) connected to the selected memory cells MC in the NAND string 4 being applied with a read voltage Vcgrv (the voltage AR in the binary data read). In addition, the word lines WL (the non-selected word lines WL0, WL1, . . . ) connected to the non-selected memory cells MC are applied with a read pass voltage Vread1_r for rendering conductive the memory cells MC regardless of data held in the memory cells MC. Then, the dummy word lines DWL0 and DWL1 connected to the dummy transistors DT are also applied with the read pass voltage Vread1_r. Then, the select gate lines SGS and SGD are applied with the voltage Vsg for rendering conductive the select gate transistors SG0 and SG1. The bit lines BL connected to the NAND string 4 having the selected memory cells MC are applied with the voltage Vb1 to detect using the sense amplifier/latch circuit 3 whether the NAND string 4 conducts a current, thus determining data.

With reference to FIG. 6B, the data read operation of the memory cells MC in the normal storage area 1*b* is performed with the word lines WL (for example, the selected word line WL61) connected to the selected memory cells MC in the NAND string 4 being provided with the read voltage Vcgrv (any of the voltages AR, BR, and CR in the four-level data read). In addition, among the word lines WL (the non-selected word lines WL0, WL1, . . . ) connected to the non-selected memory cells MC, the word lines (WL0 and WL63) connected to the memory cells MC storing binary data are applied with the read pass voltage Vread1 for rendering conductive the memory cells MC regardless of data held in the memory cells MC. Among the word lines WL (the non-selected word lines WL0, WL1, . . . ) connected to the non-selected memory cells MC, the word lines (WL1, . . . WL62) connected to the memory cells MC storing four-level data are applied with the read pass voltage Vread2 for rendering conductive the memory cells MC regardless of data held in the memory cells MC. Then, the dummy word lines DWL0 and DWL1 connected to the dummy transistors DT are also applied with the read pass voltage Vread1. Then, the select gate lines SGS and SGD are applied with the voltage Vsg for rendering conductive the select gate transistors SG0 and SG1. The bit lines BL connected to the NAND string 4 having the selected memory cells MC are applied with the voltage Vb1 to detect using the sense amplifier/latch circuit 3 whether the NAND string 4 conducts a current, thus determining data.

In the nonvolatile semiconductor memory device according to this embodiment, in the read operation of the ROM area 1*a*, the voltage applied to the word lines WL connected to the non-selected memory cells MC is the read pass voltage Vread1_r, and in the read operation of the normal storage area 1*b*, the voltage applied to the word lines WL connected to the non-selected memory cells MC storing data of the same bit number as data of the memory cells MC in the ROM area 1*a* is the read pass voltage Vread1. The read pass voltage Vread1_r of the ROM area 1*a* is set to a value lower than the read pass voltage Vread1 of the normal storage area 1*b* (Vread1_r<Vread1).

Figure 7:
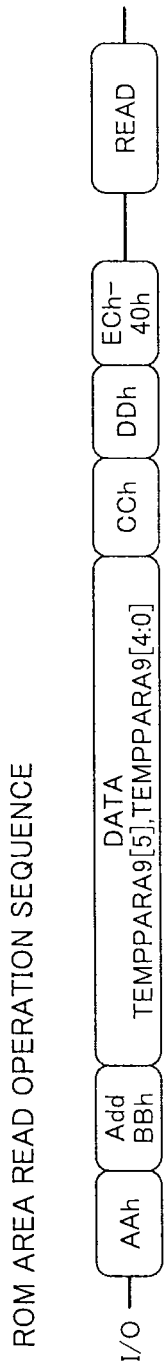
FIG. 7 illustrates a sequence in the ROM area read operation of the nonvolatile semiconductor memory device according to the first embodiment.

Next, the read operation sequence of the ROM area 1*a* of the nonvolatile semiconductor memory device according to this embodiment will be described. FIGS. 7 and 8 illustrate the read operation sequence of the ROM area 1*a*.

With reference to FIG. 7, the I/O terminal first provides a command AAh for starting the read operation and then a command Add[BBh]. The command Add[BBh] is a command to read the value of a parameter TEMPPARA9 at the position of an address BBh to determine whether to change the value of the read pass voltage Vread1_r from the read pass voltage Vread1. Next, on the basis of the command Add[BBh], the values of parameters TEMPPARA9[5] and TEMPPARA9[4:0] are read. The parameter TEMPPARA9[5] represents information determining whether the value of the read pass voltage Vread1_r is changed from the read pass voltage Vread1, and the parameter TEMPPARA9[4:0] represents information determining how much the value of the read pass voltage Vread1_r is changed from the read pass voltage Vread1.

With reference to FIG. 8, on the basis of the parameter TEMPPARA9[4:0], a change value DVREAD of the read pass voltage Vread1 is determined. Note that in FIG. 8, for the parameter TEMPPARA9[4:0]=01000 to 01111 and the parameter TEMPPARA9[4:0]=00000 to 00111, the value of the change value DVREAD of the read pass voltage Vread1 is overlapped. Then, the parameter TEMPPARA9[4:0]=01000 to 01111 may not be used or the parameter TEMPPARA9[4:0]=01000 to 01111 may be allocated with other values.

Next, a command CCh for changing the conditions of the read operation and a command DDh for setting the change value of the voltage in the read operation are provided. Subsequently, a command ECh-40h for performing the read operation of the ROM area 1*a* is provided. Then, the read operation of the ROM area 1*a* is performed. In the read operation of the ROM area 1*a*, the value of the read pass voltage Vread1_r is a value shifted by the change value DVREAD from the read pass voltage Vread1 applied to the word lines WL connected to the memory cells MC in the normal storage area 1*b* that hold data of the same bit number. The change value DVREAD may be arbitrarily changed.

[Effects]

In the nonvolatile semiconductor memory device including a floating gate memory cell MC, in the normal storage area 1*b*, increase of the number of data write/erase degrades the memory cells MC, thus drastically increasing the probability in which wrong data is read in the read operation. Meanwhile, the ROM area 1*a* is an area where the read operation is solely performed and no write/erase operations are performed. The memory cells MC in the ROM area 1*a* is thus less likely to degrade than the memory cells MC in the normal storage area 1*b*.

The parameter of the read operation of the normal storage area 1*b* (for example, the read pass voltage Vread1) is set assuming the condition in which the number of data write/erase increases and thus the memory cells MC are degraded. Therefore, the read pass voltage Vread1 in the read operation of the normal storage area 1*b* is set to a read pass voltage higher than a value set assuming the condition in which the memory cells MC are not degraded.

If this read pass voltage Vread1 in the read operation of the normal storage area 1*b* is used, in the data read operation of the ROM area 1*a*, as the read pass voltage for the memory cells storing data of the same bit number, an excessive voltage is provided on the memory cells MC in the ROM area 1*a*. Because in the ROM area 1*a* storing user read information, no data write/erase operations occur while a large number of read operations inevitably occur, it is undesirable to use, in the data read operation of the ROM area 1*a*, the read pass voltage Vread1 in the read operation of the normal storage area 1*b*.

In contrast, in the nonvolatile semiconductor memory device according to this embodiment, in the read operation of the ROM area 1*a* and the normal storage area 1*b*, even the memory cells MC storing data of the same bit number are applied at their word lines WL with different values of the read pass voltage. In the above embodiments, in the read operation of the ROM area 1*a*, the non-selected word lines WL0 to WL63 are applied with the read pass voltage Vread1_*r*, and in the read operation of the normal storage area 1*b*, the non-selected word lines WL0 and WL63 are applied with the read pass voltage Vread1. Decreasing the read pass voltage Vread1_*r* of the ROM area 1*a* below the read pass voltage Vread1 of the normal storage area 1*b* may reduce the stress applied on the memory cells MC. This may reduce the read disturb in which data of the memory cells MC in the ROM area 1*a* are changed due to the read operation of the ROM area 1*a*.

Figure 9:
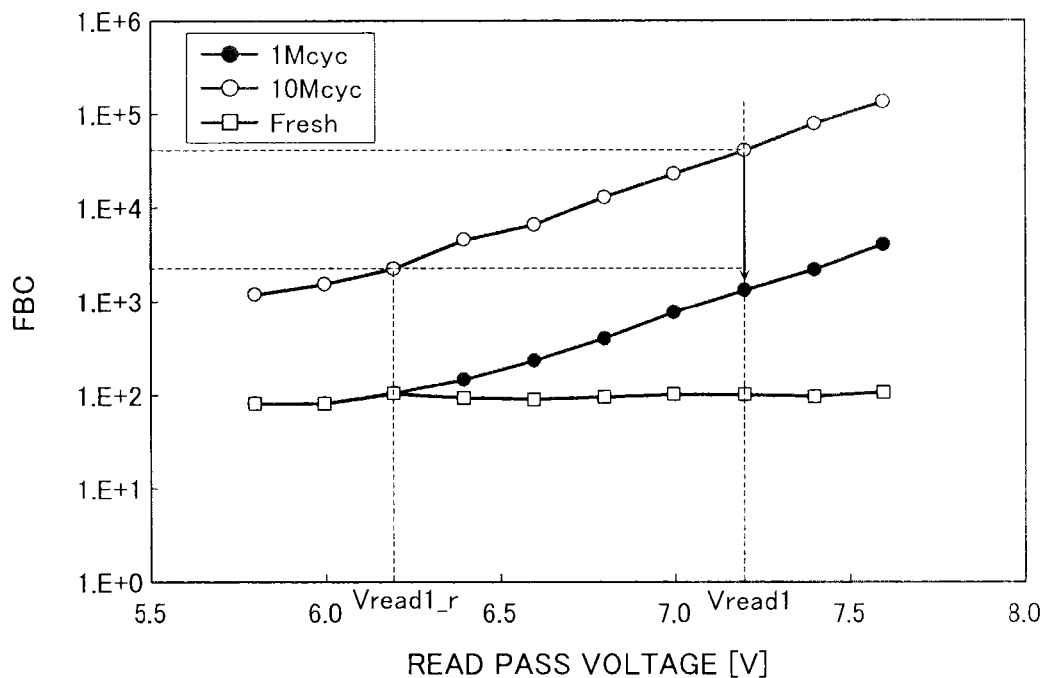
FIG. 9 illustrates effects in the ROM area read operation of the nonvolatile semiconductor memory device according to the first embodiment.

FIG. 9 is a graph showing the number of read disturbs in which data of the memory cells MC in the ROM area 1*a* is changed due to the read operation of the nonvolatile semiconductor memory device. With reference to FIG. 9, the y-axis shows the number of read disturbs (FBC: Fail Bit Count) in which the threshold voltages of the memory cells MC in the ROM area 1*a* that store "1" data are increased due to the read operation of the ROM area 1*a*, thus changing "1" data to "0" data. The x-axis in FIG. 9 shows the value of the read pass voltage used in the read operation of the ROM area 1*a*.

With reference to FIG. 9, each set of data corresponds to the state in which the memory cells MC are not degraded (Fresh), the state in which 1 M read operations are repeated to the memory cells MC in the ROM area 1*a*, and the state in which 10 M read operations are repeated to the memory cells MC in the ROM area 1*a*. As the value of the read pass voltage in the read operation increases, the number of read disturbs increases in which data of the memory cells MC in the ROM area 1*a* is changed after the read operations are repeated to the memory cells MC.

The nonvolatile semiconductor memory device according to this embodiment uses, for the memory cells MC holding data of the same bit number, the read pass voltage Vread1_*r* in the read operation of the ROM area 1*a* and the read pass voltage Vread1 in the read operation of the normal storage area 1*b*. The use of the read pass voltage Vread1_*r* in the read operation of the ROM area 1*a* decreases, compared to the use of the read pass voltage Vread1, the number of read disturbs, by a factor of about 20, in which data of the memory cells MC in the ROM area 1*a* is changed. The nonvolatile semiconductor memory device of this embodiment may reduce the malfunction in the data read operation of the ROM area 1*a*, thus performing the read operation correctly.

Second Embodiment

With reference now to FIGS. 10 to 13, a second embodiment of the present invention will be described. The entire configuration of the nonvolatile semiconductor memory device in the second embodiment is similar to that in the first embodiment, and thus its detailed description is omitted here. In addition, like elements as those in the first embodiment are designated by like reference numerals, and repeated description thereof is omitted here.

In the first embodiment, the read pass voltages are different between in the read operation of the ROM area 1*a* and in the read operation of the normal storage area 1*b*. In the read operation of this embodiment, the read pass voltages are different in a plurality of read operations of the normal storage area 1*b*, unlike that in the first embodiment. With reference to FIGS. 10 to 13, the read operation of the nonvolatile semiconductor memory device according to this embodiment will be described below.

First, with reference to FIG. 10, before describing the read operation of the second embodiment, the effects of the degradation of the memory cells MC will be described. Then, with reference to FIGS. 11 to 13, the read operation of this embodiment will be described.

If, in the nonvolatile semiconductor memory device, data written in the memory cells MC is not accessed for along term, the charge accumulation layers of the memory cells MC discharge electrons, thus decreasing the threshold voltages of the memory cells MC. FIG. 10 shows the effects by the change of the threshold voltages of the memory cells MC.

Figure 10:
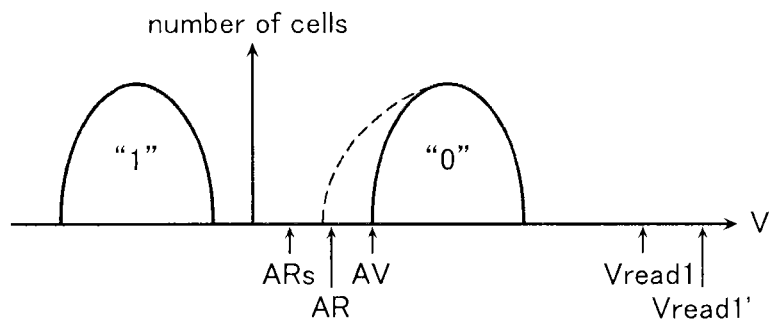
FIG. 10 shows threshold voltage distributions of memory cells of a nonvolatile semiconductor memory device according to a second embodiment.
Figure 10:
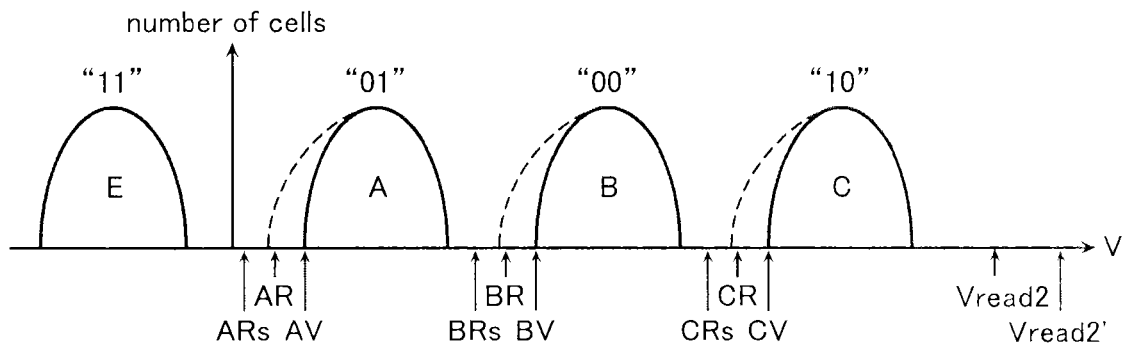

FIG. 10 illustrates the threshold voltage distributions and the read voltages in the read operation. With reference to FIG. 10, as the threshold voltages of the memory cells MC change, the threshold voltage distributions (broken line) of the memory cells MC are changed below the threshold voltage distributions (solid line) in the data write. Then, the lower limit values of the threshold voltage distributions A, B, and C may be below the respective voltage values of the read voltages AR, BR, and CR. This may render conductive the selected memory cells MC that are originally to be in the off-state, thus preventing the correct read operation of the selected memory cells MC.

An example of read operation adapted to the change of the threshold voltages will be described. In the nonvolatile semiconductor memory device, in order to prevent misreading due to the change of the threshold voltages of the memory cells MC, a different read operation is performed using read voltages different from the read voltages used in the normal read operation. Specifically, if many reading errors occur in the normal read operation, thus making it hard to perform the correct data read, the voltages applied to the selected word lines WL are changed from the read voltages AR, BR, and CR in the normal read operation to the read voltages ARs(<AR), BRs(<BR), and CRs(<CR) as shown in FIG. 10, and the data read operation is performed again. The read voltages ARs, BRs, and CRs are set to values lower than the lower limit values of the respective threshold voltage distributions (the broken line distributions in FIG. 10) in which the lower tails are stretched. In addition, the read voltages ARs, BRs, and CRs are set to be positioned between the upper limit and lower limit of the respective threshold voltage distributions in which the lower tails are stretched. Such read voltages ARs, BRs, and CRs may be used to perform the data read operation of the memory cell MCs correctly.

The read operation with the read voltages applied to the selected word lines WL being changed from the original voltages AR, BR, and CR to the voltages ARs, BRs, and CRs may hereinafter be referred to as a "shift-read operation".

In addition, if the change of the threshold voltages of the memory cells MC causes the selected memory cells MC that are originally to be in the off state to be in nearly on state, the voltage state of the bit lines BL sensed by the sense amplifier/latch circuit 3 in the read operation easily changes from the "H" state to the "L" state. In contrast, in order to make it hard for the bit lines BL to be discharged into the "L" state, the amount of current provided from the bit lines BL may be increased. Therefore, the nonvolatile semiconductor memory device according to this embodiment changes the voltages applied to the non-selected word lines WL from the read pass voltages Vread1 and Vread2 in the normal read operation to read pass voltages Vread1' and Vread2' higher than the voltages in the normal read operation.

[Read Operation According to Second Embodiment]

Figure 11:
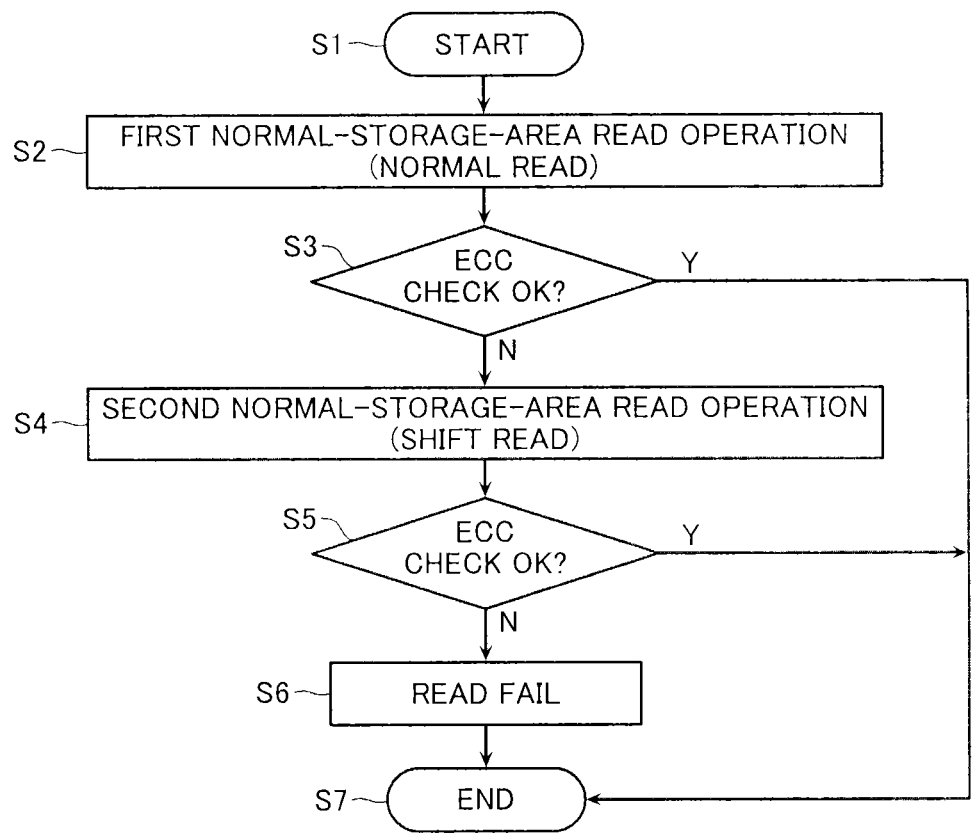
FIG. 11 is a flowchart illustrating read operation of the nonvolatile semiconductor memory device according to the second embodiment.
Figure 12:
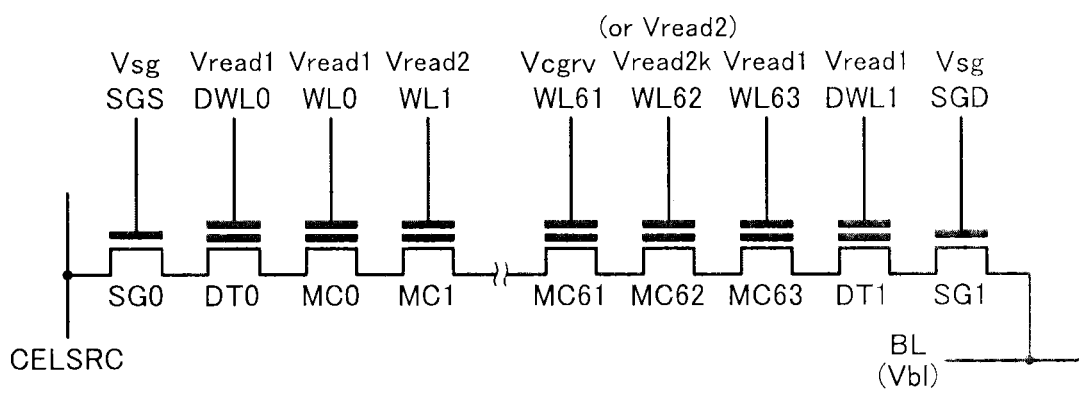
FIG. 12 illustrates applied voltages in a first normal-storage-area read operation of the nonvolatile semiconductor memory device according to the second embodiment.
Figure 13:
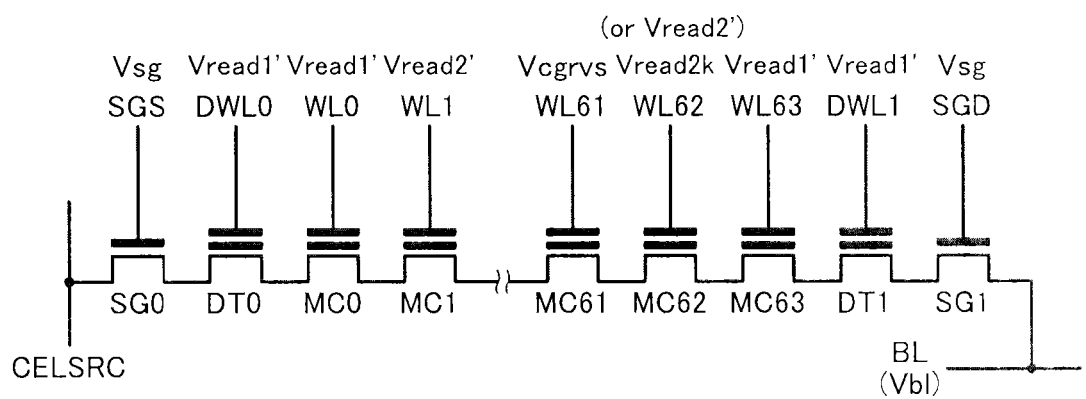
FIG. 13 illustrates applied voltages in a second normal-storage-area read operation of the nonvolatile semiconductor memory device according to the second embodiment.

With reference now to FIGS. 11 to 13, the procedure of the data read operation in this embodiment will be described. Note that in the following discussion, it is assumed that the data read operation is performed in the normal storage area 1b. In addition, in the following discussion, in the normal storage area 1b, for example the memory cells MC connected to the word lines WL0 and WL63 adjacent to the dummy word lines DWL at the two ends of each memory string store binary data, and the memory cells MC connected to the word lines WL1 to WL62 store four-level data.

First, when a command is input from the controller 11, the data read operation starts on the normal storage area 1b (step S1). Next, the normal read operation (a first normal-storage-area read operation) using the read voltage Vcgrv (any of the voltages AR, BR, and CR in the four-level data read) is performed (step S2). After the normal read operation, an ECC check is performed determining whether an error correction is possible on data read by the read operation (step S3). When the number of reading errors is small enough to perform the error correction, it is determined that the data read is performed correctly, and the data read operation is ended (step S7).

However, when the number of reading errors is too large to perform the error correction, it is determined that the threshold voltages of the memory cells MC are changed, and control proceeds to a second normal-storage-area read operation (step S4). In the second normal-storage-area read operation, the voltage applied to the selected word lines WL is changed from the normal read voltage Vcgrv (any of the voltages AR, BR, and CR in the four-level data read) to the voltage Vcgrvs (any of the voltages ARs, BRs, and CRs in the four-level data read), and the shift-read operation is performed. After the second normal-storage-area read operation, the ECC check is performed (step S5). When the number of reading errors is small enough to perform the error correction, it is determined that the data read is performed correctly, and the read operation is ended (step S7). However, when the number of reading errors is too large to perform the error correction even in the second normal-storage-area read operation, it is determined that the data read fails, and the read operation is ended (step S6 and step S7).

FIGS. 12 and 13 illustrate the applied voltages in the normal storage area read operation of the nonvolatile semiconductor memory device according to this embodiment.

With reference to FIG. 12, the first normal-storage-area read operation is performed with the word lines WL (for example, the selected word line WL61) connected to the selected memory cells MC in the NAND string 4 being provided with the read voltage Vcgrv (any of the voltages AR, BR, and CR in the four-level data read). In addition, among the word lines WL (non-selected word lines WL0, WL1, ...) connected to the non-selected memory cells MC, the word lines (WL0 and WL63) connected to the memory cells MC storing binary data are applied with the read pass voltage Vread1 for rendering conductive the memory cells MC regardless of data held in the memory cells MC. Among the word lines WL (the non-selected word lines WL0, WL1, ...) connected to the non-selected memory cells MC, the word lines (WL1, ... WL62) connected to the memory cells MC storing four-level data are applied with the read pass voltage Vread2 for rendering conductive the memory cells MC regardless of data held in the memory cells MC. Then, the dummy word lines DWL0 and DWL1 connected to the dummy transistors DT are also applied with the read pass voltage Vread1. Then, the select gate lines SGS and SGD are applied with the voltage Vsg for rendering conductive the select gate transistors SG0 and SG1. The bit lines BL connected to the NAND string 4 having the selected memory cells MC are applied with the voltage Vb1 to detect using the sense amplifier/latch circuit 3 whether the NAND string 4 conducts a current, thus determining data.

With reference to FIG. 13, the second normal-storage-area read operation is performed with the word lines WL (for example, the selected word line WL61) connected to the selected memory cells MC in the NAND string 4 being provided with the read voltage Vcgrvs (any of the voltages ARs, BRs, and CRs in the four-level data read). In addition, among the word lines WL (the non-selected word lines WL0, WL1, ...) connected to the non-selected memory cells MC, the word lines (WL0 and WL63) connected to the memory cells MC storing binary data are applied with the read pass voltage Vread1' for rendering conductive the memory cells MC regardless of data held in the memory cells MC. Among the word lines WL (the non-selected word lines WL0, WL1, ...) connected to the non-selected memory cells MC, the word lines (WL1, ... WL62) connected to the memory cells MC storing four-level data are applied with the read pass voltage Vread2' for rendering conductive the memory cells MC regardless of data held in the memory cells MC. Then, the dummy word lines DWL0 and DWL1 connected to the dummy transistors DT are also applied with the read pass voltage Vread1'. Then, the select gate lines SGS and SGD are applied with the voltage Vsg for rendering conductive the select gate transistors SG0 and SG1. The bit lines BL connected to the NAND string 4 having the selected memory cells MC are applied with the voltage Vb1 to detect using the sense amplifier/latch circuit 3 whether the NAND string 4 conducts a current, thus determining data.

In the nonvolatile semiconductor memory device according to this embodiment, the first normal-storage-area read operation uses the read pass voltage Vread1 or Vread2, and the second normal-storage-area read operation uses the read pass voltage Vread1' or Vread2'. The read pass voltage Vread1' in the second normal-storage-area read operation is set to a value higher than the read pass voltage Vread1 in the first normal-storage-area read operation (Vread1<Vread1'). In addition, the read pass voltage Vread2' in the second normal-storage-area read operation is set to a value higher than the read pass voltage Vread2 in the first normal-storage-area read operation (Vread2<Vread2').

Note that the non-selected word line WL62 (and a not-shown non-selected word line WL60) adjacent to the selected word line WL61 may be controlled to be applied with a read pass voltage Vread2$k$ higher than the voltage applied to the other non-selected word lines WL0, WL1, (Vread2<Vread2$k$). The read pass voltage Vread2$k$ may be the same in the first normal-storage-area read operation and in the second normal-storage-area read operation. For the non-selected word line WL62 (and the not-shown non-selected word line WL60) adjacent to the selected word line WL61, the adjacent selected word line WL is applied with the read voltage Vcgrv. In contrast, for each of the other non-selected word lines WL, the two adjacent word lines WL are applied with the read pass voltage. Thus, the non-selected word lines WL62 and WL60 have a different voltage application state from the other non-selected word lines WL. The application of the read pass voltage Vread2$k$ higher than the read pass voltage Vread2 applied to the other non-selected word lines WL may cancel the effects of the interference of the read voltage Vcgrv of the adjacent selected word line WL.

In addition, the read pass voltage Vread1 and the read pass voltage Vread2 in the first normal-storage-area read operation and the read pass voltage Vread1' and the read pass voltage Vread2' in the second normal-storage-area read operation may also be arbitrarily changed in response to a command, like the above read pass voltage Vread1_$r$ in the first embodiment. The read voltage Vcgrvs in the second normal-storage-area read operation may also be arbitrarily changed in response to a command.

[Effects]

In the nonvolatile semiconductor memory device of this embodiment, the ECC check performed during the read operation determines whether data is read correctly. When it is determined that the memory cells are degraded and the data is not read correctly, then the shift-read operation is performed. Because the ECC check may determine whether the memory cells are degraded, the ECC check may be used to change the parameter of the read operation of the normal storage area 1$b$ (for example, the read pass voltage Vread1' and the read pass voltage Vread2').

In the nonvolatile semiconductor memory device according to this embodiment, the normal read operation and the shift-read operation are performed on the normal storage area 1$b$ with different values of the read pass voltages. In this embodiment, the normal read operation is performed with the application of the read pass voltage Vread1 or the read pass voltage Vread2, and the shift-read operation is performed with the application of the read pass voltage Vread1' or the read pass voltage Vread2'.

In the nonvolatile semiconductor memory device of this embodiment, the value of the read pass voltage in the shift-read operation is set to a value higher than the value of the read pass voltage in the normal read operation. The shift-read operation is performed only when the ECC check determines that the memory cells MC are degraded. Therefore, in the normal read operation, the non-selected memory cells MC are not applied with the excessive voltage. This may reduce the read disturb in which data of the memory cells MC is changed due to the read pass voltage. Meanwhile, in the shift-read operation, the read pass voltage is set in consideration of the degraded state of the memory cells MC, and thus the data read operation may be performed correctly. According to the nonvolatile semiconductor memory device in this embodiment, the malfunction may be reduced in the data read operation of the normal storage area 1$b$ and thus the read operation may be performed correctly.

Some embodiments of the present invention have been described, but these embodiments are shown by way of example and are not intended to limit the scope of the invention. These new embodiments may be implemented in various other forms, and be subjected to various omissions, replacements, and modifications without departing from the spirit of the present invention. These embodiments and variants thereof are within the scope and spirit of the invention, and are also within the scope of the invention as defined in the appended claims and the equivalents thereof.

For example, the above second embodiment is described assuming that the two types of read operations of the normal storage area 1$b$ use different values of the read pass voltages. Then, as in the first embodiment, the read pass voltage may be different in the ROM area 1$a$ and in the normal storage area 1$b$. In the above embodiments, the memory cells MC connected to the word lines WL0 and WL63 at the respective two ends of the memory string store binary data, and the memory cells MC connected to the word lines WL1 to WL62 store four-level data. The memory cells MC storing binary data may not be provided at the two ends of the memory strings, but at one end of the memory string, or alternatively, a plurality of memory cells MC storing binary data may be provided at at least one end of the memory string. In addition, other memory cells MC may store multi-level data with even more bit number than four-level data, such as eight-level data.

What is claimed is:

1. A nonvolatile semiconductor memory device comprising:
   a memory cell array comprising a plurality of NAND strings arranged therein, each NAND string comprising a memory string comprising a plurality of memory cells connected in series, and a first select transistor and a second select transistor connected to respective two ends of the memory string,
   a plurality of word lines connected to respective control gate electrodes of the memory cells;
   a plurality of bit lines connected to respective first ends of the NAND strings;
   a source line connected to second ends of the NAND strings; and
   a control circuit performing reading of data of the memory cells,
   the memory cell array comprising a ROM area for data read and a normal storage area capable of arbitrary write/erase of data,
   the control circuit being configured to apply, when reading data of a first selected memory cell provided in the ROM area, a first read voltage to a first selected word line connected to the first selected memory cell, and apply to a first non-selected word line connected to a first non-selected memory cell provided in the ROM area, a first read pass voltage for rendering conductive regardless of data held in the first non-selected memory cell, thus allowing for a ROM area reading operation of reading a threshold voltage set in the first selected memory cell,
   the control circuit being also configured to apply, when reading data of a second selected memory cell provided in the normal storage area, a second read voltage to a second selected word line connected to the second selected memory cell, and apply to a second non-selected word line connected to a second non-selected memory cell provided in the normal storage area, the second non-selected memory cell storing data of a same bit number as data of the first non-selected memory cell, a second read pass voltage for rendering conductive regardless of data held in the second non-selected memory cell, thus allowing for a normal storage area reading operation of reading a threshold voltage set in the second selected memory cell, and the first read pass voltage being lower than the second read pass voltage.

2. The nonvolatile semiconductor memory device according to claim 1, wherein the control circuit is configured to be able to arbitrarily change a value of the first read pass voltage.

3. The nonvolatile semiconductor memory device according to claim 1, wherein the first and second non-selected memory cells are configured to be able to store binary data.

4. The nonvolatile semiconductor memory device according to claim 1, wherein the second non-selected memory cell storing data of a same bit number as data of the first non-selected memory cell is provided at at least one of the ends of the memory string.

5. The nonvolatile semiconductor memory device according to claim 3, wherein the control circuit is configured to apply, when reading data of the second selected memory cell, to a third non-selected word line connected to a third non-selected memory cell provided in the normal storage area, the third non-selected memory cell storing data of different bit number from the first non-selected memory cell, a third read pass voltage for rendering conductive regardless of data held in the third non-selected memory cell, and the third read pass voltage is higher than the second read pass voltage.

6. A nonvolatile semiconductor memory device comprising:

a memory cell array comprising a plurality of NAND strings arranged therein, each NAND string comprising a memory string comprising a plurality of memory cells connected in series, and a first select transistor and a second select transistor connected to respective two ends of the memory string, a plurality of word lines connected to respective control gate electrodes of the memory cells;

a plurality of bit lines connected to respective first ends of the NAND strings;

a source line connected to second ends of the NAND strings; and a control circuit performing reading of data of the memory cells, the control circuit being configured to apply a first read voltage to a selected word line connected to a selected memory cell provided in a predetermined storage area of the memory cell array, and apply to a non-selected word line connected to a non-selected memory cell provided in the predetermined storage area, a first read pass voltage for rendering conductive regardless of data held in the non-selected memory cell, thus allowing for a first read operation of reading a threshold voltage set in the selected memory cell, the control circuit being also configured to apply a second read voltage to the selected word line of the predetermined storage area, and apply to the non-selected word line of the predetermined storage area, a second read pass voltage for rendering conductive regardless of data held in the non-selected memory cell, thus allowing for a second read operation of rereading the threshold voltage set in the selected memory cell, and the second read pass voltage is higher than the first read pass voltage.

7. The nonvolatile semiconductor memory device according to claim 6, wherein the control circuit is configured to be able to set, in the first read operation and the second read operation, a same value on an adjacent read pass voltage applied to an adjacent non-selected word line adjacent to the selected word line.

8. The nonvolatile semiconductor memory device according to claim 6, wherein the second read voltage is lower than the first read voltage.

9. The nonvolatile semiconductor memory device according to claim 6, wherein the control circuit is configured to be able to arbitrarily change a value of the second read pass voltage.

10. The nonvolatile semiconductor memory device according to claim 7, wherein the adjacent read pass voltage is higher than the first read pass voltage.

11. The nonvolatile semiconductor memory device according to claim 6, wherein the control circuit is configured to be able to perform an ECC check operation of determining whether an error correction is possible on data read by the first read operation.

12. The nonvolatile semiconductor memory device according to claim 11, wherein the control circuit is configured to be able to perform the second read operation when the ECC check operation determines that an error correction is not possible on data read by the first read operation.

13. The nonvolatile semiconductor memory device according to claim 6, wherein the memory cell is configured to be able to store multi-level data of three or more levels, and the control circuit is configured to be able to set a plurality of said first read voltages and a plurality of said second read voltages corresponding to respective levels of the multi-level data.

14. A nonvolatile semiconductor memory device comprising:

a memory cell array comprising a plurality of NAND strings arranged therein, each NAND string comprising a memory string comprising a plurality of memory cells connected in series, and a first select transistor and a second select transistor connected to respective two ends of the memory string, a plurality of word lines connected to respective control gate electrodes of the memory cells;

a plurality of bit lines connected to respective first ends of the NAND strings;

a source line connected to second ends of the NAND strings; and a control circuit configured to apply a read voltage to a selected word line connected to a selected memory cell provided in a predetermined storage area of the memory cell array, and apply to a non-selected word line connected to a non-selected memory cell provided in the predetermined storage area, a read pass voltage for rendering conductive regardless of data held in the non-selected memory cell, thus allowing for a read operation of reading a threshold voltage set in the selected memory cell, the control circuit being configured to be able to change a value of the read pass voltage in response to a command.

15. The nonvolatile semiconductor memory device according to claim 14, wherein the control circuit is configured to be able to perform reread operation of rereading the threshold voltage set in the selected memory cell, and the control circuit is configured to change a value of the read pass voltage in the reread operation from a value of the read pass voltage in the read operation.

16. The nonvolatile semiconductor memory device according to claim 15, wherein the control circuit is configured to change a value of the read voltage in the reread operation from a value of the read voltage in the read operation.

17. The nonvolatile semiconductor memory device according to claim 16, wherein the control circuit is configured to be able to perform an ECC check operation of determining whether an error correction is possible on data read by the read operation.

18. The nonvolatile semiconductor memory device according to claim 17, wherein the control circuit is configured to be able to change, when the ECC check operation determines that an error correction is not possible on data read by the read operation, values of the read voltage and the read pass voltage and perform the reread operation of rereading the threshold voltage set in the selected memory cell.

19. The nonvolatile semiconductor memory device according to claim 14, wherein the memory cell is configured to be able to store multi-level data of three or more levels, and the control circuit is configured to be able to set a plurality of said read voltages corresponding to respective levels of the multi-level data.

* * * * *